United States Patent
Clatanoff et al.

(10) Patent No.: US 6,864,577 B2
(45) Date of Patent: Mar. 8, 2005

(54) VIA PLUG ADAPTER

(75) Inventors: William J. Clatanoff, Austin, TX (US); Gayle R. T. Schueller, Austin, TX (US); Robert J. Schubert, Cedar Park, TX (US); Yusuke Saito, Tokyo (JP); Hideo Yamazaki, Kanagawa (JP); Hideaki Yasui, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/132,960

(22) Filed: Apr. 26, 2002

(65) Prior Publication Data

US 2002/0113312 A1 Aug. 22, 2002

Related U.S. Application Data

(63) Continuation of application No. 09/141,217, filed on Aug. 27, 1998, now Pat. No. 6,400,018.

(51) Int. Cl.[7] .................... H01L 23/48; H01L 23/52; H01L 29/40
(52) U.S. Cl. .................... 257/737; 257/738
(58) Field of Search .................... 257/737, 738, 257/700; 438/640, 613, 614

(56) References Cited

U.S. PATENT DOCUMENTS

| | | | |
|---|---|---|---|
| 3,541,222 A | 11/1970 | Parkes et al. | |
| 4,830,264 A | 5/1989 | Bitaillou et al. | |
| 5,203,075 A | 4/1993 | Angulas et al. | |
| 5,401,913 A | 3/1995 | Gerber et al. | |
| 5,491,303 A | 2/1996 | Weiss | |
| 5,600,884 A | 2/1997 | Kondo et al. | |
| 5,663,594 A | 9/1997 | Kimura | |
| 5,726,497 A | 3/1998 | Chao et al. | |
| 5,753,973 A | * 5/1998 | Yasunaga et al. | 257/737 |
| 5,757,078 A | 5/1998 | Matsuda et al. | |
| 5,945,741 A | * 8/1999 | Ohsawa et al. | 257/777 |
| 5,973,393 A | * 10/1999 | Chia et al. | 257/690 |
| 6,114,187 A | * 9/2000 | Hayes | 438/106 |
| 6,400,018 B2 | * 6/2002 | Clatanoff et al. | 257/737 |

FOREIGN PATENT DOCUMENTS

| | | |
|---|---|---|
| DE | 19 702 014 A1 | 4/1998 |
| EP | 0 702 404 A2 | 3/1996 |
| EP | 0 751 565 A2 | 1/1997 |
| EP | 0 751 565 A2 * | 2/1997 |
| JP | 10-41356 | 7/1996 |

OTHER PUBLICATIONS

Charles A. Harper, Ronald M. Sampson, "Electronic Materials & Processes Handbook", Second Edition, p. 7.25.*

(List continued on next page.)

Primary Examiner—Phat X. Cao
(74) Attorney, Agent, or Firm—Melanie G. Gover

(57) ABSTRACT

A circuit includes a substrate having a dielectric layer with a first surface and a second surface. A conductive layer is formed on the first surface. A beveled via is formed in a dielectric layer of the substrate. The via has a first opening of a first width in the first surface, and a second opening of a second width in the second surface, the second width being greater than the first width. A conductive plug is connected to the conductive layer. The plug is formed in the via and extends from adjacent the first opening toward the second opening, and terminates adjacent the second opening at a plug interface surface. A conductive solder ball is connected to the plug interface surface and extends to protrude from the second surface.

25 Claims, 3 Drawing Sheets

OTHER PUBLICATIONS

Product Brochure, "*Single Chip Bumping for Flip Chip Applications*," Packaging Technologies GmbH, Reinckestrasse 8, 14612 Falkensee, Germany.

Product Brochure, "*Wafer Bumping Service*," Packaging Technologies GmbH, Reinickestrasse 8, 14612 Falkensee, Germany.

J.H. Lau and Y.H. Pao, *Solder Joint Reliability of BGS, CSP, Flip Chip, and Fine Pitch SMT Assemblies*, pp. 257–258, McGraw Hill, New York (1997).

J.H. Lau (ed.), *Ball Grid Array Technology*, pp. 137–138, McGraw Hill, New York (1995).

* cited by examiner

VIA PLUG ADAPTER

This is a continuation of application Ser. No. 09/141,217, filed on Aug. 27, 1998, now U.S. Pat. No. 6,400,018.

BACKGROUND

The disclosures herein relate generally to solder ball electronic interconnections and more particularly to a via plug adapter for strengthening a solder ball connection in a beveled via.

Vertical interconnects between circuit layers is well known. U.S. Pat. No. 3,541,222 discloses a connector screen for interconnecting aligned electrodes of adjacent circuit boards or modules. The connector screen comprises a matrix of spaced conductive connector elements embedded in a supporting non-conducting material with the conductive connector elements protruding from both sides thereof. The size and spacing of the connector elements are chosen so that the connector screen can be disposed between the circuit boards or modules to provide the required interconnections between the electrodes without requiring alignment of the connector screen with respect to the boards or modules. A preferred method of making the connector screen involves forming a conductive mold having a grid pattern of ridges in a non-conductive base. Conductive material is then cast between the ridges of the mold, following which selected portions of the mold are removed to form a web of non-conductive material supporting a matrix of spaced conducting elements protruding from both sides of the web.

U.S. Pat. No. 4,830,264 describes a method of forming solder terminals for a pinless module, preferably for a pinless metallized ceramic module. The method is comprised of the following steps: forming a substrate having a pattern of conductors formed onto its top surface and preformed via-holes extending from the top to bottom surface; applying a droplet of flux at at least one of the preformed via-hole openings of the bottom surface of the substrate to fill the via-holes with flux by capillarity and form a glob of flux at the bottom openings; applying a solder preform, i.e. solder balls on each glob of flux to which it will adhere, the volume of the preform being substantially equal to the inner volume of the via-hole plus the volume of the bump to be formed; heating to cause solder reflow of the solder preform to fill the via-hole and the inner volume of the eyelet with solder; and, cooling below the melting point of the solder so that the molten solder solidifies to form solder terminals at the via-hole locations while forming solder columns in the via-holes. The resultant pinless metallized ceramic module has connections between the I/O's of the module interfacing with the next level of packaging (i.e., printed circuit boards), that consist of integral solder terminals. Each integral solder terminal comprises a column in the vias of the metallized ceramic substrate, a mound of solder at the top surface of the substrate and spherical solder bumps on the bottom level for making interconnections with the next level of packaging.

In U.S. Pat. No. 5,401,913, a multi-layer circuit board includes electrical interconnections between adjacent circuit board layers of the multi-layer board. A via hole is provided through a circuit board layer. The via hole is filled with a via metal. The via metal is plated with a low melting point metal. An adhesive film is deposited over the circuit board layer. Adjacent layers of the multi-layer circuit board are stacked and aligned together. The layers are laminated under heat and pressure. The low melting point metal provides an electrical interconnection between adjacent layers.

U.S. Pat. No. 5,491,303 discloses an interposer for connecting two or more printed circuit boards comprising a circuit-carrying substrate with two or more solder pads on each of two sides. Each of the solder pads are connected to an electrically conductive via in the substrate, providing electrical interconnection from one side to the other side. Each solder pad has a solder bump on it. A circuit assembly is made by soldering the solder bumps on one side of the interposer to corresponding solder pads on a printed circuit board. The solder bumps on the other side of the interposer are likewise soldered to the corresponding solder pads of a second printed circuit board.

U.S. Pat. No. 5,600,884 describes an electrical connecting member, one surface of which is connected to a connecting section of a first electrical circuit member and another surface of which is connected to a connecting section of a second electrical circuit member. The electrical connecting member includes a holding member formed of an electrically insulative member. The holding member has a plurality of recess holes. The connecting member also includes a plurality of electrically conductive members provided in the electrically insulative member, insulated from each other. One end of the electrically conductive members is exposed on one surface of the holding member to be connected to the connecting section of the first electrical circuit member. Another end of the electrically conductive members is exposed on another surface of the holding member to be connected to the connecting section of the second electrical circuit member.

U.S. Pat. No. 5,726,497 discloses a method of manufacture of a semiconductor device on a silicon semiconductor substrate which comprises formation of a first stress layer on the semiconductor substrate, formation of an interconnect layer over the first stress layer, formation of a second stress layer on the interconnect layer, formation of an inter-metal dielectric (IMD) layer over the second stress layer, patterning and etching a via opening through the inter-metal dielectric layer and the second stress layer, exposing a contact area on the surface of the metal interconnect layer, and heating the device at a temperature sufficient to squeeze the metal interconnect layer up into the via.

U.S. Pat. No. 5,757,078 discloses a semiconductor device including a semiconductor chip having electrode pads, a package composed of a plurality of insulating films and adhered to the semiconductor chip by an adhesive agent. The package includes wiring patterns interposed between the plurality of insulating films. The wiring patterns are selectively connected to the electrode pads at one end, and to the plurality of electrically conductive protrusions at the other end, by means of via-holes. The semiconductor device further includes a plurality of electrically conductive protrusions extending from the outermost wiring patterns by way of the via-holes provided in the outermost insulating film.

Japanese Application JP 10-41356 discloses a tape carrier that is used as the bonding medium when semiconductor elements are bonded to the outer part of a substrate board for a BGA application. An insulating film includes vias having straight or non-tapered walls. A conductive land is formed in the vias and solder balls have one side engaged with the lands inside of the vias. The remainder of each solder ball protrudes from the insulating film.

The use of flexible circuitry in IC packaging has been a growing trend for many years where the use of via connections through the flexible circuit dielectric have been employed in Tape Ball Grid Array (TBGA) IC packaging applications and recently, into Chip Scale Packaging (CSP) applications. In Ball Grid Array (BGA) applications, the via interconnection traditionally uses a solder ball reflowed first to connect to the flexible circuitry through the via, then second, reflowed onto the printed circuit board with conventional surface mount assembly practices.

This solder ball connection must make a reliable electronic interconnect from the flexible circuitry to the printed circuit board. This reliability is often directly related to the area of the solder connection to the flexible circuitry, as a common failure mode of this interconnection is the solder ball shearing through the solder material at the point of the minimum cross sectional area. Therefore, larger vias are desirable to increase the area in which shear stress is distributed to meet minimum solder ball interconnection reliability requirements.

Conversely, the demand for smaller electronic packages and higher input/output (I/O's) requires increased routing density, including smaller via sizes to allow electronic traces to route between solder ball via areas. Smaller vias require smaller via capture pads, thus, allowing more space to route electronic traces between printed circuit board interconnection vias.

Traditionally, vias in the dielectric are made by punching, leaving a via through the dielectric with straight walls. Other methods include chemically dissolving the dielectric and laser drilling to expose the metal conductor of the flexible circuitry. Direct solder ball attachment to any of these via methods controls the solder ball interconnection reliability by means of the via size, such that, vias typically have to be larger than 0.200 mm in diameter to meet minimum reliability requirements for the electronic package.

Therefore, what is needed is an apparatus and a method for providing a strong and reliable solder ball connection to flexible circuitry with small diameter vias and via capture pads so as to permit more space in which to route more electronic traces.

SUMMARY

One embodiment, accordingly, provides a strength enhanced solder ball connection to flexible circuitry with small diameter vias which improves the routability of the flexible circuit to address higher I/O and finer pitch flex based BGA packaging applications. To this end, a circuit comprises a substrate including a dielectric layer having a first surface and a second surface. A conductive layer is on the first surface. A beveled via is formed in the dielectric layer and has a first opening of a first width in the first surface, and a second opening of a second width in the second surface, greater than the first width. A conductive plug is formed in the via, connected to the conductive layer, and extends from adjacent the first opening toward the second opening. The plug terminates adjacent the second opening at a plug interface surface. A conductive solder ball is connected to the plug interface surface and extends to protrude from the second surface.

A principal advantage of this embodiment is that the via adapter plug enables a reliable solder ball connection to flexible circuitry with small (less than 0.200 mm diameter) vias. Using the via plug adapter concept, solder ball interconnection reliability does not have to be compromised to accommodate the routing requirements of high I/O, fine pitch flex based IC packaging applications. Using common design rules for flexible circuitry, a smaller via allows for a smaller via capture pad, thus, more space between via capture pads in which to route electronic traces.

DETAILED DESCRIPTION

Figure 1:
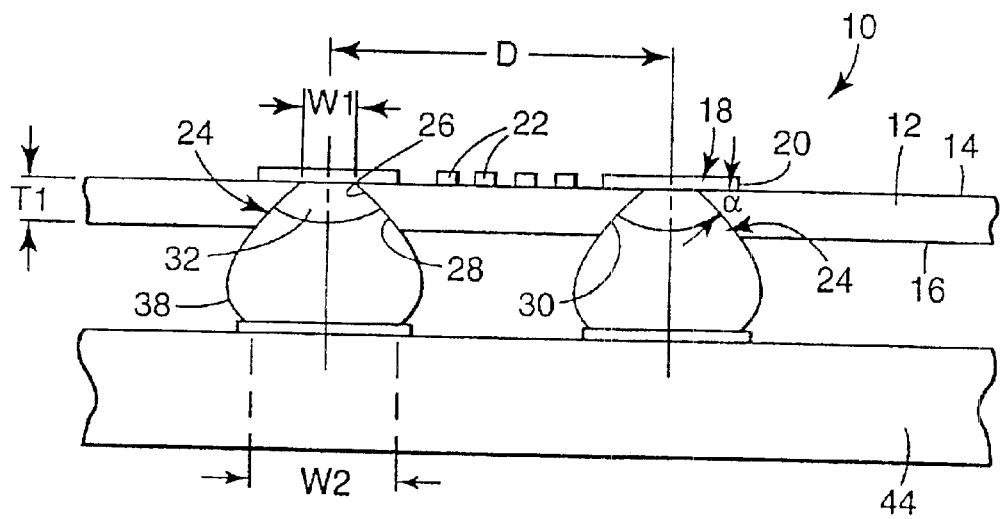
FIG. 1 is a side view illustrating an embodiment of a substrate interconnected to a circuit board by a plurality of solder balls.

According to one embodiment, FIG. 1, a flexible circuit 10 comprises a substrate 12 formed of a flexible dielectric material. The substrate 12 is of a polymer or other suitable material having a thickness T1 of from about 0.5 mils to about 5.0 mils. The polymer may be a polyimide, a polyester, or other known polymers for electronic applications. Substrate 12 also includes a first surface 14 and a second opposite surface 16. A conductive layer 18, of copper, gold plated copper, gold or other suitable material, is formed on first surface 14 and includes a plurality of conductive capture pads 20 and a plurality of conductive traces 22 routed between the capture pads 20.

Figure 1A:
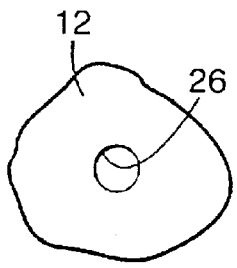
FIG. 1A is a top view illustrating a circular via opening.
Figure 1B:
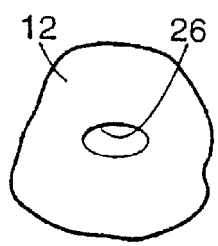
FIG. 1B is a top view illustrating an oblong via opening.

A plurality of beveled vias 24 are formed in substrate 12. Each via 24 has a first opening 26 of a first width W1, in first surface 14, and a second opening 28 of a second width W2, in the second surface 16. Second width W2 is greater than first width W1. Beveled via 24 includes a sidewall 30 which is sloped away from first surface 14 at an angle α of from about 20 degrees to about 80 degrees, and preferably at an angle of from about 20 degrees to about 45 degrees. First opening 26 is circular, FIG. 1A, or oblong, FIG. 1B or may be of another suitable shape and first width W1 is from about 0.05 mm to about 0.5 mm.

Figure 2:
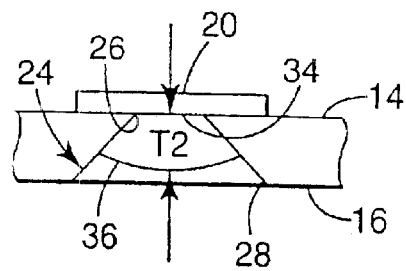
FIG. 2 is a side view illustrating an embodiment of a plug in a tapered via.
Figure 3:
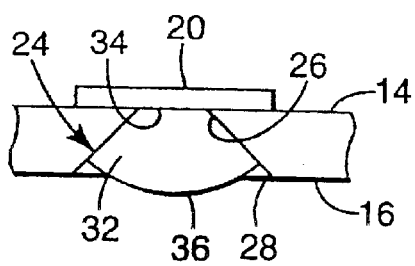
FIG. 3 is another side view illustrating an embodiment of a plug in a tapered via.
Figure 4:
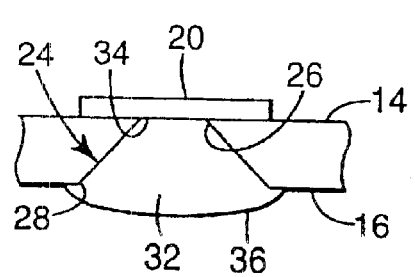
FIG. 4 is another side view illustrating an embodiment of a plug in a tapered via.

A conductive plug 32, FIGS. 1 and 2 is formed in beveled via 24, and extends from a first plug interface surface 34, adjacent first opening 26, toward the second opening 28. Plug 32 terminates adjacent the second opening 28 at a second plug interface surface 36. The first plug interface surface 34 is connected to conductive capture pad 20. The second plug interface surface 36 is of a dome shape. Second plug interface surface 36 may be formed to terminate between first surface 14 and second surface 16, may be formed such that a portion of the dome extends outwardly from the second surface 16, FIG. 3, or may be formed such that the entire dome-like surface extends outwardly from the second surface 16, FIG. 4. Thus, a range of plug thickness or height T2 extending from first plug interface surface 34 to second plug interface surface 36 may vary, but is at least 5 microns, FIG. 2.

Figure 5:
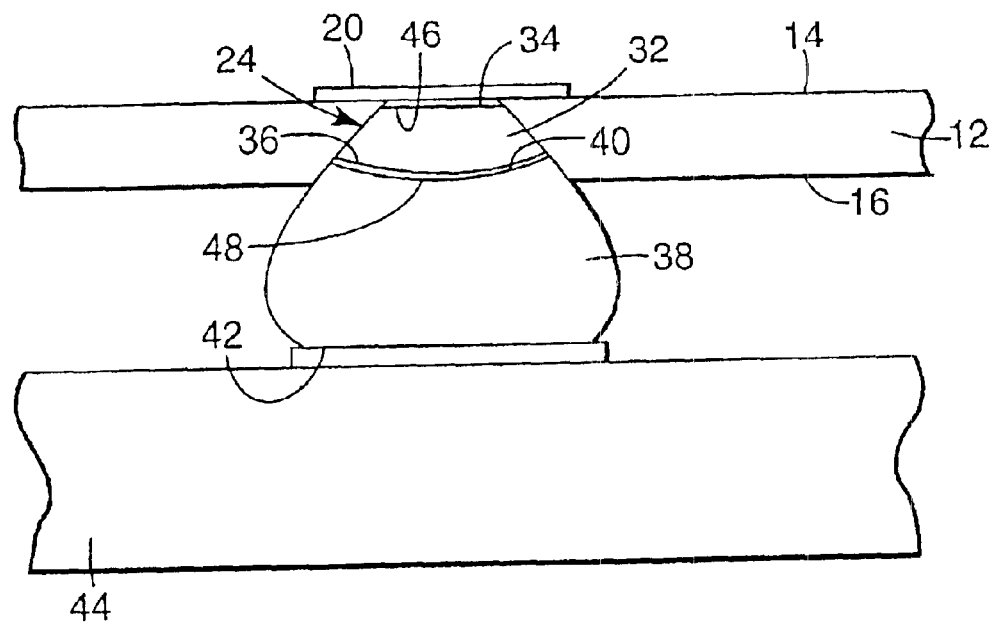
FIG. 5 is a side view illustrating an embodiment of a substrate interconnected to a circuit board by a solder ball.

A conductive solder ball 38, FIG. 5, is connected to second plug interface surface 36 at a first solder ball surface 40, and protrudes from second substrate surface 16. Solder ball 38 terminates at a second solder ball surface 42 which may engage a printed circuit board 44. Plug 32 and solder ball 38 may be formed of various suitable materials. For example, plug 32 may be formed of a high temperature tin-lead solder engaged with solder ball 38 formed of a eutectic tin-lead solder. Also, plug 32 may be formed of copper engaged with solder ball 38 formed of a tin-lead solder. Other combinations may be used which meet the conductivity requirement and meet the condition that they provide the plug material of a stronger shear strength than the solder ball material. As a further example, plug 32 may be formed of nickel engaged with solder ball 38 formed of a tin-lead solder. In addition, for improved bonding, an interface coating 46 may be provided between capture pads 20 and first plug interface surface 34. Coating 46 may be formed of a suitable material selected from gold, paladium and nickel-gold. Furthermore, bonding between plug 32 and solder ball 38 may be improved by another interface coating 48 therebetween. Coating 48 may be formed of a suitable material also selected from gold, paladium and nickel-gold.

Beveled vias 24, FIG. 1, are spaced apart in a side-by-side configuration. Capture pads 20 are formed at each first opening 26. Therefore, capture pads 20 are also spaced apart in a side-by-side configuration. Spacing between vias 24 is of a center-to-center distance D of from about 0.25 mm to about 1.27 mm. This spacing permits at least three traces 22 to pass between side-by-side capture pads 20.

Figure 6:
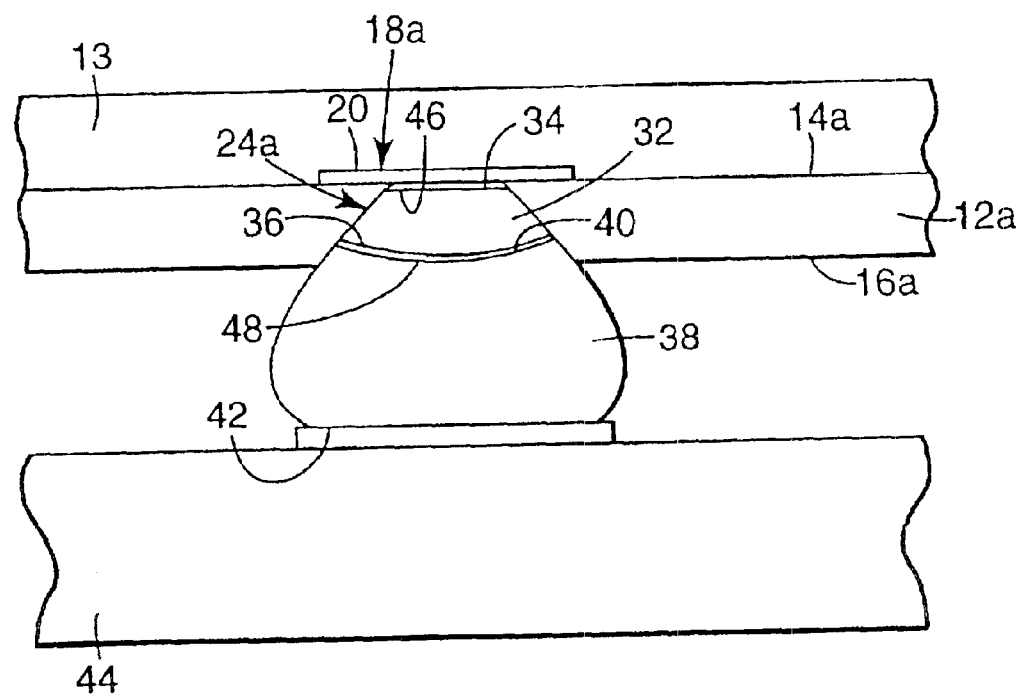
FIG. 6 is a side view illustrating an embodiment of a two-layered substrate interconnected to a circuit board by solder ball.

In FIG. 6, circuit 10 includes a substrate including a first dielectric layer 12a and a second dielectric layer 13. First dielectric layer 12a includes a first surface 14a and a second surface 16a. A conductive layer 18a is provided on first surface 14a between first dielectric layer 12a and second dielectric layer 13. A beveled via 24 is formed in first dielectric layer 12a as described and referred to above. Also, the second dielectric layer 13 may be formed of a polymer material as described above. One of the layers 12a and 13 may be provided as a cover coat for the other layer.

Figure 7:
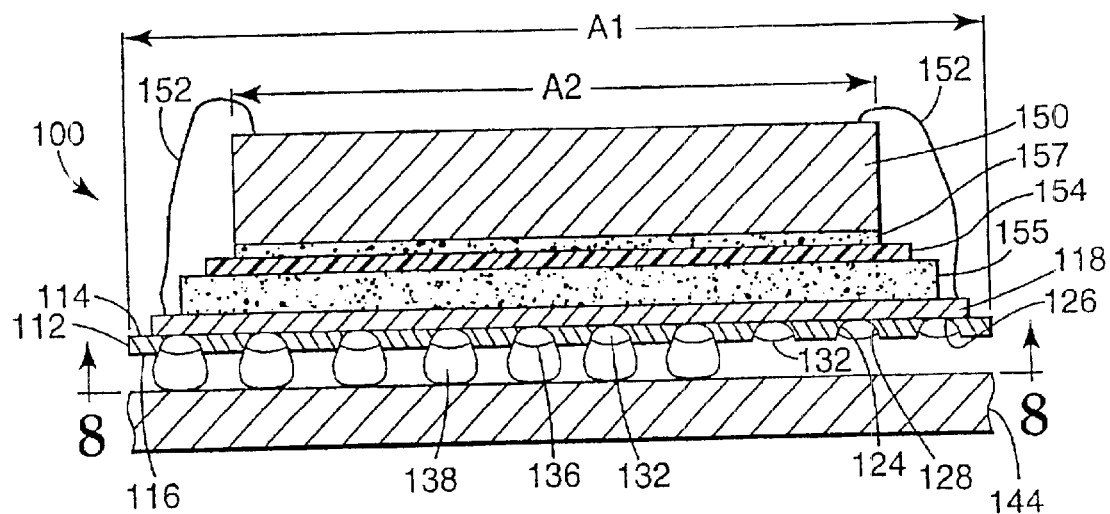
FIG. 7 is a side view illustrating an embodiment of a chip scale package including an IC chip connected to a substrate.
Figure 8:
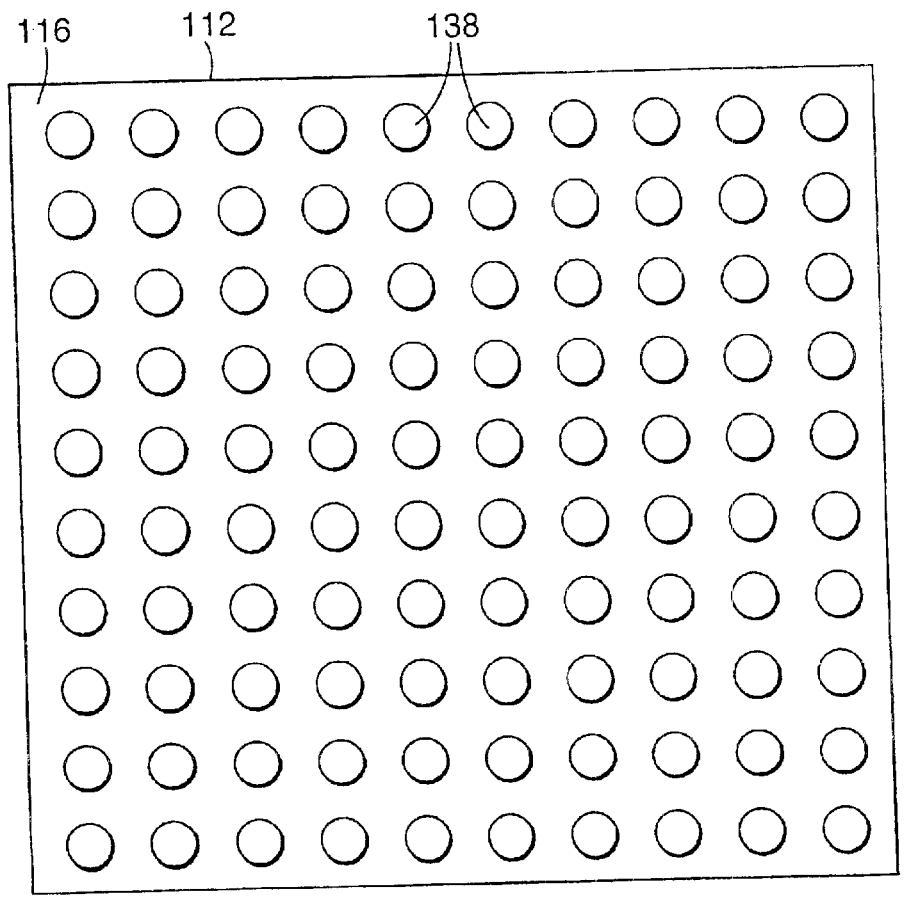
FIG. 8 is a view of the substrate taken along line 8—8 of FIG. 7.

Well known tape ball grid array (TBGA) package typically includes a substrate having an integrated circuit (IC) mounted in a cavity that is surrounded by an array of vias. Leads from the IC interconnect to the vias. One embodiment herein, FIGS. 7 and 8, discloses a substantial improvement such that the substrate is substantially of the same surface area as the IC. This is possible due to the reduced size openings of the tapered vias as described above. Thus, the advantages provided by the reduced size openings permits increased trace routing between the vias. Also, the opposite or larger via openings provide increased surface contact to improve solder ball shear strength. The chip scale package 100, FIG. 7, includes a substrate 112 having a first surface 114 and a second surface 116. A surface area A1 of first surface 114 is substantially the same as a second surface area A2 of an IC 150 mounted on substrate 112. A conductive layer 118 on portions of first surface 114 area is connected to IC 150 by leads 152. An adhesive layer 155 on surface 114 of substrate 112, and an adhesive layer 157 on IC 150 are interconnected by an interposer layer 154 therebetween. The interposer layer 154 may, for example, be a compliant material such as a foam or elastomeric material, or a non-compliant material such as a ceramic or a copper sheet. Substrate 112 includes a plurality of beveled vias 124, as described above. Each via includes a first opening 126 in first surface 114 and a second opening 128 in second surface 116. The second width being greater than the first width as herein described. A plug 132 is provided in each via to extend from adjacent the first opening 126 to adjacent the second opening 128 and terminating at a plug interface surface 136. A conductive solder ball 138 is connected to the plug interface surface 136 and extends to protrude from second surface 116 for connection to a printed circuit board 144. Thus, a plurality of solder balls 138 provide an array which is uniform across second surface 116 of substrate 112, without interruption by a commonly heretofore known space required for mounting an IC package on opposite surface 114.

As it can be seen, the principal advantages of these embodiments are that the via plug adapter enables a reliable solder ball connection to flexible circuitry with small (less than 0.200 mm diameter) vias. Using the via plug adapter concept, solder ball interconnection reliability does not have to be compromised to accommodate the routing requirements of high I/O, fine pitch flex based IC packaging applications. Using common design rules for flexible circuitry, a smaller via allows for a smaller via capture pad, thus, more space between via capture pads in which to route electronic traces. As an example, using a via plug adapter in a 0.085 mm diameter beveled via, 4 traces can be routed between capture pads with similar solder ball interconnection reliability as with 0.300 mm diameter vias that only allow routing of a single trace.

The foregoing describes a flexible circuit with a z-axis via interconnection between fine feature flexible circuitry and gross feature printed circuit board solder ball pads using traditional solder balls with the novel use of a via plug adapter. One such application of this via plug adapter is the flexible circuit application in IC packaging for BGA to printed circuit board interconnection.

The via plug adapter is a metal plug additively plated into a beveled via. In addition to forming the plug using an additive plating process, a process such as solder reflow could be used to form the via plug. This via plug adapter is a frustum (the solid of a cone between two parallel planes) shaped metal feature with a slight dome shape, or slight bowl shape (i.e., the center is concave), at the second interface surface. As the z-direction thickness of the frustum grows within the beveled via, the surface area for traditional solder ball attachment grows dramatically creating a mechanical adapter allowing small vias to have similar solder ball interconnection reliability as with large via applications.

Allowing small vias in the flexible circuit improves the routability of the flexible circuit to address higher I/O and finer pitch flex based BGA packaging applications.

As a result, one embodiment provides a circuit comprising a substrate including a dielectric layer having a first surface and a second surface. A conductive layer is on the first surface. A beveled via is formed in the dielectric layer. The via has a first opening of a first width in the first surface and a second opening of a second width, in the second surface, greater than the first width. A conductive plug is connected to the conductive layer and is formed in the via and extends from adjacent the first opening toward the second opening. The plug terminates adjacent the second opening at a plug interface surface. A conductive solder ball is connected to the plug interface surface, and extends to protrude from the second surface.

Another embodiment provides a circuit comprising a substrate including a dielectric layer having a first surface and a second surface. A conducted layer is on the first surface. A beveled via is formed in the dielectric layer. The via has a first opening of a first width in the first surface and a second opening of a second width in the second surface, greater than the first width. A conductive plug is connected to the conductive layer and is formed in the via and extends from adjacent the first opening toward the second opening. The plug terminates adjacent the second opening at a plug interface surface. A conductive solder ball has a first solder ball surface connected to the plug interface surface. The solder ball extends to protrude from the second surface and terminates at a second solder ball surface. A printed circuit board is engaged with the second solder ball surface.

In still another embodiment, a circuit comprises a substrate including a dielectric layer having a first surface and a second surface. A pair of side-by-side beveled vias are formed in the dielectric layer. Each via has a first opening of a first width in the first surface, and a second opening of a second width in the second surface, greater than the first width. Each via includes a conductive plug having a first plug interface surface adjacent the first opening. Each plug extends from adjacent the first plug interface surface toward the second opening. Each plug terminates adjacent the second opening at a second plug interface surface. A conductive solder ball is formed at each via and has a first solder ball surface engaged with its respective second plug interface surface, and extends to protrude from the second surface. Each solder ball terminates at a second solder ball surface. A printed circuit board is engaged with the second solder ball surface. A conductive capture pad layer is engaged with the first interface surface of each plug to form side-by-side, spaced apart, capture pad layers. A plurality of conductive traces extend between the side-by-side capture pad layers.

A further embodiment provides a method of attaching a solder ball to a via in a flexible circuit substrate. This is accomplished by forming a beveled via in the flexible circuit substrate having a first surface and a second surface. A first via opening is formed in the first surface and has a first width. A second via opening is formed in the second surface and has a second width, greater than the first width. A conductive layer is formed at the first opening. A conductive plug is formed in the beveled via connected to the conductive layer so that the plug extends from adjacent the first surface toward the second surface. The plug terminates at a plug interface surface adjacent the second surface. A conductive solder ball is engaged with the plug interface surface. The solder ball extends to protrude from the second surface.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An electronic package, comprising:
   a flexible substrate having first and second surfaces;
   a plurality of capture pads and traces disposed on said first surface of said substrate, thereby forming a flexible circuit;
   a plurality of beveled vias disposed in said substrate and extending between the first and second surfaces thereof, each of said vias having a first opening of a first width in the first surface and a second opening of a second width in the second surface, the second width being greater than the first width, each of said vias being sloped away from said first surface at an angle within the range of about 20° to about 80°;
   a plurality of conductive plugs, each of said plugs being disposed in one of said vias and terminating in a first plug surface, said plug comprising a first material;
   a plurality of solder balls, each of said solder balls being disposed on the first surface of one of said plugs and comprising a second material having a lower shear strength than said first material, wherein said first plug surface is disposed between said first and second openings of the via;
   an integrated circuit disposed on said first surface of said substrate; and
   a printed circuit board disposed on a second surface of said substrate, said printed circuit board being connected to said second surface, by way of said plurality of solder balls, across a space bounded on a first side by said printed circuit board and bounded on a second side by said second surface.

2. The package of claim 1, wherein said first material comprises a material selected from the group consisting of nickel and copper.

3. The package of claim 2, wherein said second material comprises a tin-lead solder and said first material comprises nickel.

4. The package of claim 1, wherein said substrate comprises a polymeric dielectric material.

5. The package of claim 1, wherein said substrate comprises a polyimide.

6. The package of claim 1, wherein said substrate comprises a polyester.

7. The package of claim 1, wherein said substrate has a conductive layer disposed on said first surface.

8. The package of claim 7, wherein said substrate and said conductive layer form a flexible circuit.

9. The package of claim 7, wherein said integrated circuit is mounted on said conductive layer.

10. The package of claim 7, wherein said conductive layer comprises copper.

11. The package of claim 7, wherein said conductive layer comprises gold.

12. The package of claim 7, wherein said conductive layer comprises gold-plated copper.

13. The package of claim 1, wherein said substrate has a thickness within the range of about 0.5 mils to about 5.0 mils.

14. The package of claim 1, wherein said plug also terminates in a second surface which is in contact with said conductive layer.

15. The package of claim 2, wherein the integrated circuit has a surface area substantially the same size as the first surface area.

16. The package of claim 1, wherein each of said vias being sloped away from said first surface at an angle within the range of about 20° to about 45°.

17. The package of claim 1, wherein the first opening is circular.

18. The package of claim 17, wherein the first opening has a diameter within the range of about 0.05 mm to about 0.5 mm.

19. The electronic package of claim 1 wherein the center of the first plug surface is concave.

20. An electronic package, comprising:
   a flexible circuit comprising a polymeric dielectric substrate having first and second surfaces, said substrate having a conductive layer disposed on said first surface;

a plurality of beveled vias disposed in said substrate and extending between the first and second surfaces thereof, each of said vias having a first opening of a first width in the first surface, and a second opening of a second width in the second surface, the second width being greater than the first width, each of said vias being sloped away from said first surface at an angle within the range of about 20° to about 450°;

a plurality of conductive plugs, each of said plugs being disposed in one of said vias and terminating in a first plug surface which is in contact with said conductive layer and a second plug surface which is disposed between the first and second surface of the via in which it is disposed, said plug comprising a first material selected from the group consisting of nickel, copper and high temperature tin-lead solders;

a plurality of solder balls, each of said solder balls being disposed on the second plug surface of one of said plugs;

an integrated circuit disposed on said first surface of said substrate; and a printed circuit board disposed on a second surface of said substrate, said printed circuit board being connected to said second surface, by way of said plurality of solder balls, across a space bounded on a first side by said printed circuit board and bounded on a second side by said second surface.

21. The electronic package of claim 20 wherein the center of the first plug surface is concave.

22. A flexible circuit for connection to an integrated circuit, comprising:

a flexible substrate having first and second surfaces;

a plurality of beveled vias disposed in said substrate and extending between the first and second surfaces thereof, each of said vias having a first opening of a first width in the first surface, and a second opening of a second width in the second surface, the second width being greater than the first width, each of said vias being sloped away from said first surface at an angle within the range of from about 20° to about 80°;

a plurality of conductive plugs, each of said plugs being disposed in one of said vias and terminating in a first plug surface, said plug comprising a first material;

a plurality of solder balls, each of said solder balls being disposed on the first surface of one of said plugs and comprising a second material having a lower shear strength than said first material, wherein said first plug surface is disposed between said first and second openings of the via.

23. A flexible circuit according to claim 22, wherein said first material comprises a material selected from the group of nickel and copper.

24. A flexible circuit according to claim 23, wherein said second material comprises a tin-lead solder.

25. The flexible circuit of claim 22 wherein the center of the first plug surface is concave.

* * * * *